United States Patent [19]

Meier et al.

[11] Patent Number: 5,073,476

[45] Date of Patent: Dec. 17, 1991

[54] CURABLE COMPOSITION AND THE USE THEREOF

[75] Inventors: Kurt Meier, Allschwil; Giuliano Eugster, Itingen; Franz Schwarzenbach, Reinach; Hans Zweifel, Basel, all of Switzerland

[73] Assignee: Ciba-Geigy Corporation, Ardsley, N.Y.

[21] Appl. No.: 608,753

[22] Filed: May 10, 1984

[30] Foreign Application Priority Data

May 18, 1983 [CH] Switzerland ............... 2691/83-1

[51] Int. Cl.$^5$ .................. C08F 4/42; C08G 59/68; G03F 7/004; G03F 7/029
[52] U.S. Cl. ............................ 430/280; 430/281; 430/286; 430/288; 522/24; 522/26; 522/27; 522/28; 522/29; 522/66; 522/100; 522/103; 522/107
[58] Field of Search .............. 204/159.24; 522/24, 522/26, 27, 28, 29, 66; 430/280, 281, 286, 288

[56] References Cited

U.S. PATENT DOCUMENTS

| | | | |
|---|---|---|---|
| 3,425,988 | 2/1969 | Gorman et al. | 528/50 |
| 3,705,129 | 12/1972 | Murio et al. | 528/412 |
| 3,855,040 | 12/1974 | Malofsky | 526/301 |
| 3,956,420 | 5/1976 | Kato et al. | 525/100 |
| 4,273,668 | 6/1981 | Crivello | 252/182 |
| 4,343,885 | 8/1982 | Reardon | 430/281 |
| 4,446,246 | 5/1984 | McGinniss | 525/291 |
| 4,808,638 | 2/1989 | Steinkraus | 522/24 |
| 4,857,437 | 8/1989 | Banks | 522/24 |

FOREIGN PATENT DOCUMENTS 2058528  2/1990  Japan .............................. 522/24

OTHER PUBLICATIONS

Kochetkova, Chem. Abs. 98(9):72366v.
Palazzotto, Chem. Abs. 101(18):153584x.

*Primary Examiner*—Marion E. McCamish
*Assistant Examiner*—A. H. Koeckert
*Attorney, Agent, or Firm*—Luther A. R. Hall

[57] ABSTRACT

Iron (II)-aromatic compound complexes mixed with electron acceptors as an oxidizing agent are suitable initiators for the polymerization by irradiation of organic material which can be polymerized by cations and/or free radicals. The composition composed of the polymerizable material and of the initiator mixture is suitable for the production of protective coatings and can be used as a photographic recording material.

16 Claims, No Drawings

CURABLE COMPOSITION AND THE USE THEREOF

The present invention relates to a curable composition composed of a) a material which can be polymerised by cations and/or by free radicals, b) an iron(II)-aromatic compound complex and c) an oxidising agent, a process for polymerising such material by the action of radiation, a material coated with the composition and the use thereof.

It is known from the literature that, for example, iodonium, sulfonium and diazonium salts are suitable photoinitiators for the radiation-induced polymerisation of organic material which can be polymerised by cations (see, for example, German Auslegeschrift 2,518,639, J. Polym. Sci., Polymer Chemistry Ed., 17, 1059 (1979), Makromol. Chem., Suppl. 3, 348 (1979), German Offenlegungsschriften 2,520,489, 2,854,011 and 3,021,376, U.S. Pat. No. 4,210,449 and British Patent application No. 2,046,269A). Owing to their relatively low-wavelength absorption range (about 190 to 400 nm), these known photoinitiators require the use of sensitisers, such as coloured polycyclic hydrocarbons, for example perylene dyes, aromatic amines, benzoin alkyl ethers or alkoxyacetophenones, in order to cure, by the action of light, systems which can be polymerised by cations. The curing by heat of systems containing such photoinitiators is preferably carried out in the presence of reducing agents, such as copper, tin, iron or cobalt salts, thiophenols, ascorbic acid and the like.

Our own investigations have shown that metallocene complex salts are photoinitiators for organic materials polymerisable by cations, and do not require the concomitant use of sensitisers. These materials can be cured either without further treatment at high temperatures or, after the action of radiation, at temperatures higher than the temperature of irradiation. It would be more advantageous if the polymerisation could be carried out at ever lower temperatures or merely by the action of irradiation and the heating due to the heat of polymerisation. It is also desirable that it should be possible to polymerise organic materials which can be polymerised simultaneously by cations or free radicals or by both mechanisms, by means of a photoinitiator and under the action of radiation.

The object of the present invention is to provide a curable composition meeting these requirements.

The present invention relates to a curable composition containing a) a material which can be polymerised by free radicals or cations, mixtures of these materials or a material which can be polymerised by free radicals and cations, b) at least one iron compound of the formula I

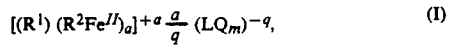  (I)

in which a is 1 or 2 and q is 1, 2 or 3, L is a divalent to heptavalent metal or non-metal, Q is a halogen atom, m is an integer corresponding to the sum of the valencies of L and q, $R^1$ is a $\pi$—arene and $R^2$ is the anion of a —arene, and c) at least one electron acceptor as an oxidising agent.

Suitable $\pi$-arenes $R^1$ are, in particular, aromatic groups having 6 to 24 carbon atoms or hetero-aromatic groups having 3 to 20 carbon atoms, it being possible for these groups to be unsubstituted or monosubstituted or polysubstituted by identical or different monovalent radicals, such as halogen atoms, preferably chlorine or bromine atoms, or $C_1$–$C_8$-alkyl, $C_2$–$C_8$-alkenyl, $C_2$–$C_8$-alkynyl, $C_1$–$C_8$-alkoxy, cyano, $C_1$–$C_8$-alkylthio, alkyl $C_2$–$C_6$-monocarboxylate, phenyl, $C_2$–$C_5$-alkanoyl or benzoyl groups. These $\pi$-arene groups can be mononuclear systems, condensed polynuclear systems or non-condensed polynuclear systems, it being possible in the last-mentioned systems for the nuclei to be linked directly or via bridge members, such as —S— or —O—.

As the anion of a $\pi$-arene, $R^2$ can be an anion of a $\pi$-arene of the type mentioned above, for example the indenyl anion and, in particular, the cyclopentadienyl anion, it being also possible for these anions to be unsubstituted or monosubstituted or polysubstituted by identical or different monovalent radicals, such as $C_1$–$C_8$-alkyl, $C_2$–$C_8$-alkenyl, $C_2$–$C_8$-alkynyl, alkyl $C_2$–$C_6$-monocarboxylate, cyano, $C_2$–$C_5$-alkanoyl or benzoyl groups.

The alkyl, alkoxy, alkylthio, alkyl monocarboxylate and alkanoyl substituents can be linear or branched. Typical alkyl, alkoxy, alkylthio, alkyl monocarboxylate or alkanoyl substituents which may be mentioned are methyl, ethyl, n-propyl, isopropyl, n-butyl, sec.-butyl, tert-butyl, n-pentyl, n-hexyl and n-octyl, methoxy, ethoxy, n-propoxy, isopropoxy, n-butoxy, n-hexyloxy and n-octyloxy, methylthio, ethylthio, n-propylthio, isopropylthio, n-butylthio, n-pentylthio and n-hexylthio, methyl, ethyl, n-propyl, isopropyl, n-butyl and n-pentyl carboxylate, and acetyl, propionyl, butyryl and valeroyl, respectively. In this respect, preference attaches to alkyl, alkoxy, alkylthio and alkyl monocarboxylate groups having 1 to 4, and especially 1 or 2, carbon atoms in the alkyl moieties, and to alkanoyl groups having 2 or 3 carbon atoms. Preferred substituted $\pi$-arenes or anions of substituted $\pi$-arenes are those containing one or two of the abovementioned substituents, in particular chlorine or bromine atoms or methyl, ethyl, methoxy, ethoxy, cyano, methyl or ethyl carboxylate and acetyl groups.

Suitable hetero-aromatic $\pi$-arenes are systems containing S, N and/or O atoms. Hetero-aromatic $\pi$-arenes containing S and/or O atoms are preferred. Examples of suitable $\pi$-arenes are benzene, toluene, xylenes, ethylbenzene, methoxybenzene, ethoxybenzene, dimethoxybenzene, p-chlorotoluene, chlorobenzene, bromobenzene, dichlorobenzene, acetylbenzene, trimethylbenzene, trimethoxybenzene, naphthalene, 1,2-dihydronaphthalene, 1,2,3,4-tetrahydronaphthalene, methylnaphthalenes, methoxynaphthalenes, ethoxynaphthalenes, chloronaphthalenes, bromonaphthalenes, biphenyl, indene, biphenylene, fluorene, phenanthrene, anthracene, 9,10-dihydroanthracene, triphenylene, pyrene, naphthacene, coronene, thiophene, chromene, xanthene, thioxanthene, benzothiophene, naphthothiophene, thianthrene, diphenylene oxide, diphenylene sulfide, acridine and carbazole.

Examples of anions of substituted $\pi$-arenes are the anions of methylcyclopentadiene, ethylcyclopentadiene, n-propylcyclopentadiene and n-butylcyclopentadiene and the anions of dimethylcyclopentadiene, methyl and ethyl cyclopentadiene-carboxylate and acetylcyclopentadiene, propionylcyclopentadiene, cyanocyclopentadiene and benzoylcyclopentadiene. Preferred anions are the anion of unsubstituted indene and especially of unsubstituted cyclopentadiene.

Preferably, a has a value of 1 and $R^1$ is benzene, toluene, xylene, methoxybenzene, chlorobenzene, p- chlorotoluene, naphthalene, methylnaphthalene, chloronaphthalene, methoxynaphthalene, biphenyl, indene, pyrene, perylene or diphenylene sulfide and $R^2$ is the anion of cyclopentadiene, acetylcyclopentadiene, methylcyclopentadiene, phenylcyclopentadiene or indene.

Complexes of the formula I which are particularly preferred are those in which a is 1, $R^1$ is $\eta^6$-pyrene or $\eta^6$-naphthalene and $R^2$ is the anion of $\eta^5$-cyclopentadiene.

Examples of suitable metals or non-metals L are Sb, Fe, Sn, Bi, Al, Ga, In, Ti, Zr, Sc, V, Cr, Mn and Cu; lanthanides, such as Ce, Pr and Nd, or actinides, such as Th, Pa, U or Np. Suitable non-metals are, in particular, B, P and As. L is preferably P, As, B or Sb, P being particularly preferred. As the halogen atom, Q is preferably Cl and especially F.

Examples of complex anions $[LQ_m]^{-q}$ are $BF_4^-$, $PF_6^-$, $AsF_6^-$, $SbF_6^-$, $FeCl_4^-$, $SnCl_6^{2-}$, $SbCl_6^-$ and $BiCl_6^-$. The particularly preferred complex anions are $SbF_6^-$, $BF_4^-$, $AsF_6^-$ and $PF_6^-$.

The compounds of the formula I are known or can be prepared by analogous processes.

The electron acceptors used as an oxidising agent are preferably an organic hydroperoxide, an organic peracid or a quinone.

The following are examples: tertiary butyl hydroperoxide, cumene hydroperoxide, triphenylmethyl hydroperoxide, tetralin hydroperoxide, α-methyltetralin hydroperoxide, decalin hydroperoxide, perbenzoic acid, m-chloroperbenzoic acid or benzoquinone.

Examples of organic materials which can be polymerised by cations and are suitable for the curable compositions according to the invention are those of the following types, it being possible to use these on their own or as mixtures of at least two components:

I. Ethylenically unsaturated compounds which can be polymerised by a cationic mechanism. These include 1. monoolefins and diolefins, for example isobutylene, butadiene, isoprene, styrene, α-methylstyrene, divinylbenzenes, N-vinylpyrrolidone, N-vinylcarbazole and acroleine. 2. Vinyl ethers, for example methyl vinyl ether, isobutyl vinyl ether, trimethylolpropane trivinyl ether and ethylene glycol divinyl ether; and cyclic vinyl ethers, for example 3,4-dihydro-2-formyl-2H-pyrane (dimeric acroleine) and the 3,4-dihydro-2H-pyran-2-carboxylic acid ester of 2-hydroxymethyl-3,4-dihydro-2H-pyran. 3. Vinyl esters, for example vinyl acetate and vinyl stearate.

II. Heterocyclic compounds which can by polymerised by cations, for example ethylene oxide, propylene oxide, epichlorohydrin and glycidyl ethers of monohydric alcohols or phenols, for example n-butyl glycidyl ether, n-octyl glycidyl ether, phenyl glycidyl ether and cresyl glycidyl ether; glycidyl acrylate, glycidyl methacrylate, styrene oxide and cyclohexene oxide; oxetans, such as 3,3-dimethyloxetane and 3,3-di-(chloromethyl)-oxetane; tetrahydrofuran; dioxolane, trioxane and 1,3,6-trioxacyclooctane; lactones, such as β-propiolactone, γ-erolactone and ε-caprolactone; thiiranes, such as ethylene sulfide and propylene sulfide; azetidines, such as N-acylazetidines, for example N-benzoylazetidine, and the adducts of azetidine with diisocyanates, for example toluylene-2,4-diisocyanate and toluylene-2,6-diisocyanate and 4,4'-diaminodiphenylmethane diisocyanate; epoxy resins; and linear and branched polymers having glycidyl groups in the side chains, for example homopolymers and copolymers of polyacrylate and polymethacrylate glycidyl esters.

Particularly important representatives of these polymerisable compounds mentioned above are the epoxide resins and, in particular, the diepoxides and polyepoxides and epoxide resin prepolymers of the type used for the preparation of crosslinked epoxy resins. The diepoxides and polyepoxides can be aliphatic, cycloaliphatic or aromatic compounds. Examples of such compounds are the glycidyl ethers and β-methyl glycidyl ethers of aliphatic or cycloaliphatic diols or polyols, for example those of ethylene glycol, propane-1,2-diol, propane-1,3-diol, butane-1,4-diol, diethylene glycol, polyethylene glycol, polypropylene glycol, glycerol, trimethylolpropane or 1,4-dimethylolcyclohexane or those of 2,2-bis-(4-hydroxycyclohexyl)-propane and N,N-bis(2-hydroxyethyl)-aniline; and the glycidyl ethers of diphenols and polyphenols, for example resorcinol, 4,4'-dihydroxydiphenylmethane, 4,4'-dihydroxydiphenyl-2,2-propane, novolaks and 1,1,2,2-tetrakis-(4-hydroxyphenyl)-ethane. Further examples are N-glycidyl compounds, for example the diglycidyl compounds of ethyleneurea, 1,3-propyleneurea or 5-dimethylhydantoin or of 4,4'-methylene-5,5'-tetramethyldihydantoin or compounds such as triglycidyl isocyanurate.

Further glycidyl compounds of industrial importance are the glycidyl esters of carboxylic acids, in particular dicarboxylic and polycarboxylic acids. Examples of these are the glycidyl esters of succinic acid, adipic acid, azelaic acid, sebacic acid, phthalic acid, terephthalic acid, tetrahydrophthalic acid, hexahydrophthalic acid, isophthalic acid or trimellitic acid or of dimerised fatty acids.

Examples of polyepoxides other than glycidyl compounds are the diepoxides of vinylcyclohexene and dicyclopentadiene, 3-(3',4'-epoxycyclohexyl)-8,9-epoxy-2,4-dioxaspiro[5.5]undecane and of 3',4'-epoxycyclohexylmethyl 3,4-epoxycyclohexanecarboxylate, butadiene diepoxide or isoprene diepoxide, epoxidised linoleic acid derivatives or epoxidised polybutadiene.

Preferred epoxide resins are diglycidyl ethers, which may be so-called advanced, of dihydric phenols or dihydric aliphatic alcohols having 2 to 4 carbon atoms. The diglycidyl ethers, which may be so-called advanced, of 2,2-bis-(4-hydroxyphenyl)-propane and of bis-(4-hydroxyphenyl)methane are particularly preferred.

Further suitable compounds which can be polymerised by cations are the following: III. Methylol compounds: 1. Aminoplasts, such as the N-hydroxymethyl, N-methoxymethyl, N-n-butoxymethyl and N-acetoxymethyl derivatives of amides or amide-like compounds, for example cyclic ureas, such as ethyleneurea (imidazolidin-2-one), hydantoin, urone (tetrahydrooxadiazin-4-one), 1,2-propyleneurea (4-methylimidazolidin-2-one), 1,3-propyleneurea (hexahydro-2H-pyrimid-2-one), hydroxypropyleneurea (5-hydroxyhexahydro-2H-pyrimid-2-one), 1,3,5-melamine and further polytriazines, such as acetoguanamine, benzoguanamine and adipoguanamine.

If desired it is possible to employ aminoplasts containing both N-hydroxymethyl and N-alkoxymethyl groups or both N-hydroxymethyl and N-acetoxymethyl groups (for example a hexamethylolmelamine in which 1 to 3 of the hydroxyl groups are etherified with methyl groups).

Preferred aminoplasts are the condensation products of urea, urone, hydantoin or melamine with formaldehyde and also partially or completely etherified products of such condensation products with an aliphatic, monohydric alcohol having 1 to 4 carbon atoms. 2.

Phenoplasts. Preferred phenoplasts are resols prepared from a phenol and an aldehyde. Suitable phenols include phenol itself, resorcinol, 2,2-bis-(p-hydroxyphenyl)-propane, p-chlorophenol, a phenol which is substituted by one or two alkyl groups each of which has 1 to 9 carbon atoms, such as o-, m- and p-cresol, the xylenols, p-tert.-butylphenol and p-nonylphenol and also phenyl-substituted phenols, in particular p-phenylphenol. The aldehyde which is condensed with the phenol is preferably formaldehyde, but other aldehydes, such as acetaldehyde and furfural, are also suitable. If desired, a mixture of such curable phenol/aldehyde resins can be used.

The preferred resols are condensation products of phenol, p-chlorophenol, resorcinol or o-, m- or p-cresol with formaldehyde.

Suitable organic materials which can be polymerised by free radicals are, in particular, monoethylenically or polyethylenically unsaturated compounds. The following are examples: styrene, vinylpyridine, vinyl acetate, divinylbenzene, vinyl ethers, acrylamide, methacrylamide, bisacrylamide, bismethacrylamide and unsaturated polyesters, particularly those based on maleic acid. Preferred materials are the esters or amides of acrylic acid and/or methacrylic acid with linear or branched alcohols, polyols or monoamines or polyamines, respectively. The polyols and polyamines can also be in the form of partial esters.

Examples of polyamines are ethylenediamine, propylenediamine, butylenediamine, hexylenediamine, phenylenediamine, benzylenediamine, naphthylenediamine, diethylenetriamine, triethylenetetramine and diaminoethyl ethers. Examples of polyols are linear and branched alkylenediols, such as ethylenediol, propylenediol, butylenediol, pentylenediol, hexylenediol, octylenediol, polyoxaalkylenediols, such as diethylene and triethylene glycol and polyethylene glycols having a molecular weight of 200 to 500, 1,4-dihydroxycyclohexane, 1,4-di-(hydroxymethyl)-cyclohexane, dihydroxybenzenes, hydroxymethylphenols, triols, such as 1,2,3-trihydroxypropane, 1,2,4-trihydroxybutane and trimethylolpropane, pentaerythritol, dipentaerythritol and low-molecular polyesters containing hydroxyl end groups.

Examples of suitable alcohols and monoamines are methanol, ethanol, propanol, butanol, pentanol, hexanol, heptanol, octanol, 2-ethylhexanol, cyclohexanol, phenol, glycidyl, methylamine, dimethylamine and ethylamine.

Examples of organic materials which can be polymerised by cations and free radicals are mixtures of the abovementioned materials which can be polymerised by cations and free radicals, respectively. Mixtures containing epoxide resins are preferred. Partial esters of epoxide resins and acrylic acid, methacrylic acid or a mixture of these acids are also suitable.

The iron compound b) and the oxidising agent c) can be present in the composition in an amount of 0.1 to 15, preferably 0.5 to 10%, by weight, relative to the polymerisable organic material. The ratio by weight of the iron compound b) to the oxidising agent c) can be between 1:10 and 5:1, preferably between 1:5 and 1:1.

The curable compositions according to the invention can be obtained, for example, in the form of homogeneous liquid mixtures or in a homogeneous or inhomogeneous glass-like form. Homogeneous, glass-like products can be obtained in a manner known per se, for example by liquefying solid, polymerisable organic materials, if appropriate by adding suitable solvents, in the dark or under red light, heating to temperatures above their glass transition point, adding the components b) and c) and cooling the resulting mixtures. If desired, the glass-like product thus obtained can subsequently be comminuted. Inhomogeneous, glass-like products can be obtained, for example, by mixing glass-like, polymerisable materials in the form of powder with the components b) and c).

The compositions according to the invention are stable, and thus storable, at room temperature and in relative darkness, for example in red light. They can be cured by heat without further treatment, preferably at temperatures near to the melting point or decomposition point of the components b) and c).

An essential advantage of the composition according to the invention is that it can be cured by the action of radiation, complete curing generally being effected by the heat formed in the reaction, and external heating being unnecessary. However, it can sometimes be preferable to apply external heating after exposure to light, for example if fairly short reaction times are desired.

The present invention also relates, therefore, to a process for the polymerisation of an organic material which can be polymerised by free radicals or cations, a mixture of these materials or a material which can be polymerised by free radicals and cations, under the action of radiation, in the presence of a photoinitiator and, if appropriate, by heat, wherein the photoinitiator is a mixture of a) at least one iron compound of the formula I

in which a is 1 or 2 and q is 1, 2 or 3, L is a divalent to heptavalent metal or non-metal, Q is a halogen atom, m is an integer corresponding to the sum of the valencies of L and q, $R^1$ is a $\pi$-arene and $R^2$ is the anion of a $\pi$-arene, and b) at least one electron acceptor as an oxidising agent, and wherein, if desired, the polymerisation reaction is subsequently completed by applying heat.

The irradiation of the curable mixture is preferably effected by means of electron beams or actinic light, preferably of a wavelength between 200 and 600 nm and an intensity between 150 and 5000 watts. Examples of suitable light sources are xenon lamps, argon lamps, tungsten lamps, carbon arcs and metal halide and metal arc lamps, such as low-pressure, medium-pressure and high-pressure mercury lamps. The irradiation is preferably carried out with metal halide lamps or high-pressure mercury lamps. The irradiation time depends on various factors, including, for example, the polymerisable organic material, the nature of the light source and the distance of the latter from the irradiated material. The irradiation time is preferably 10 to 60 seconds.

The compositions which have been exposed to light can be heated in conventional convection ovens. If short heating or reaction times are necessary, the heating can also be effected by exposure to, for example, IR radiation, IR lasers or microwave devices. The polymerisation temperatures are in the range from room temperature to about 80° C.

The compositions according to the invention can also contain further additives which are known and are customarily employed in the art of photopolymerisable materials. Examples of such additives are pigments, dyes, fillers and reinforcing agents, glass fibres and other fibres, flame-retarding substances, antistatic agents, flow control agents, antioxidants and light stabilisers, and also conventional photoinitiators, such as acetophenones, acylphosphine oxides or aromatic ketones. In order to improve the final properties of epoxide resins it is possible to incorporate polyfunctional hydroxy compounds, for example as described in German Offenlegungsschrift 2,639,395.

In order to increase their capacity to be stored in the dark, the curable compositions can contain weak organic bases, such as nitriles, amides, lactones or urea derivatives. In order to prevent premature reaction caused by unintentional exposure, small amounts of UV absorbers and/or organic dyes can be added.

The composition according to the invention can be applied by customary methods to at least one surface of a substrate. The coated material is also a subject of the invention. Examples of suitable substrates are metals and metalloids, such as steel, aluminium, copper, cadmium, zinc and silicon, and also ceramics, glass, plastics, paper and wood. The coated material can be used for the production of protective layers and passivating layers by exposure, which is a further subject of the invention.

If only part of the coating is irradiated through a photomask during exposure, the unexposed areas can subsequently be removed by means of a suitable solvent. The coated material is thus also suitable for use as a photographic recording material, for the production of printing plates and, especially, printed circuits, and also as a solder resist. Use as a photographic recording material is also a subject of the present invention.

The compositions according to the invention can also be used as adhesives or for the production of putties, fillers or fibre-reinforced composite materials and laminated substances.

The compositions according to the invention have a high sensitivity to light without further sensitisation, which also means short exposure times for curing. At the same time, initiators which are effective for cationic and free radical polymerisation are produced during exposure, which widens the field of application in respect of polymerisable materials. It is surprising in this respect that the oxidising agent only becomes effective after exposure and enables curing to be carried out by irradiation. It is very advantageous that curing is generally effected by the action of radiation without the application of external heat.

The following examples illustrate the invention in greater detail.

EXAMPLES 1–11

2.5 mg of a solution containing 50 $\mu$mole of a compound of the formula I and 250$\mu$ mole of oxidising agent per g of epoxide resin is irradiated in an aluminium crucible at 0° C. using a 1000-watt high-pressure mercury lamp. The closed crucible is transferred to a differential scanning calorimeter (DSC-30, Mettler) and heated at a heat-up rate of 20° C./minute. In the course of this the following parameters are determined: the start of the exothermic reaction ($T_{start}$), the reaction enthalpy liberated ($\Delta E$) and the temperature at maximum reaction enthalpy ($T_{max}$).

The following epoxide resins are employed:

1) A technical bisphenol A diglycidyl ether having an epoxide content of 5.2 equivalents/kg.

2) A technical cycloaliphatic epoxide of the formula

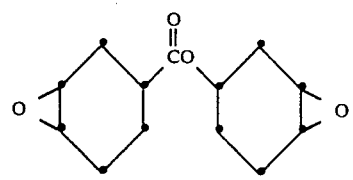

3) A glycidylised cresol-novolak having an epoxide content of 4.8 equivalents/kg.

The constituents and the results are listed in the following table. It will be seen that the polymerisation starts in the region of room temperature and proceeds to completion at low temperatures, only slightly above the starting temperature.

TABLE

| Example | Oxidising agent | Compound of the formula I | Epoxide resin | Exposure time [sec/°C.] | DSC experiment | | |
|---|---|---|---|---|---|---|---|
| | | | | | $T_{Start}$(°C.) | $T_{max}$(°C.) | $\Delta E$ j/g) |
| 1 | tertiary butyl hydroperoxide | ($\eta^6$-naphthalene) ($\eta^5$-cyclopentadienyl) Fe(II) hexafluorophosphate | 1 | 30/0 | 30 | 46 | 299 |
| 2 | tertiary butyl hydroperoxide | ($\eta^6$-naphthalene) ($\eta^5$-cyclopentadienyl) Fe(II) tetrafluoroborate | 1 | 30/0 | 20 | 53 | 187 |
| 3 | tertiary butyl hydroperoxide | ($\eta^6$-naphthalene) ($\eta^5$-cyclopentadienyl) Fe(II) hexafluoroantimonate | 1 | 30/0 | 30 | 51 | 253 |
| 4 | tertiary butyl hydroperoxide | ($\eta^6$-naphthalene) ($\eta^5$-cyclopentadienyl) Fe(II) hexafluoroarsenate | 1 | 30/0 | 30 | 47 | 253 |
| 5 | cumene hydroperoxide | as in Example 1 | 1 | 180/0 | 20 | 38 | 294 |
| 6 | m-chloroperbenzoic acid | as in Example 1 | 1 | 180/0 | 20 | 38 | 294 |
| 7 | benzoquinone | as in Example 1 | 1 | 180/0 | 55 | 79 | 252 |
| 8 | tertiary butyl hydroperoxide | as in Example 1 | 3 | 180/20 | 30 | 50 | 144 |
| 9 | perbenzoic acid | as in Example 1 | 2 | 180/0 | 20 | 54 | 91 |
| 10 | tertiary butyl hydroperoxide | ($\eta^6$-p-chlorotoluene) ($\eta^5$-cyclopentadienyl) Fe(II) hexafluorophosphate | 1 | 90/0 | 35 | 46 | 315 |

TABLE-continued

| | | | | | | | |
|---|---|---|---|---|---|---|---|
| 11 | tertiary butyl hydroperoxide | ($\eta^6$-pyrene) ($\eta^5$-cyclopentadienyl) Fe(II) hexafluorophosphate | 1 | 10/0 | 30 | 47 | 258 |

EXAMPLE 12

A solution of 2 g of a technical bisphenol A diglycidyl ether (epoxide content: 5.2 equivalents/kg), 0.1 mmol of ($\tau^6$-naphthalene)-$\tau^5$-cyclopentadienyl)iron(II) hexafluorophosphate and 0.5 mmol of cumene hydroperoxide is applied to a copper-backed epoxide plate by means of a 25 $\mu$doctor blade. A tack-free, acetoneresistant film is obtained after 30 seconds exposure (distance approx. 50 cm) to a 5000-watt metal halide lamp.

EXAMPLE 13

Example 12 is repeated using tertiary butyl hydroperoxide instead of cumene hydroperoxide. The same result is obtained.

EXAMPLE 14

A solution of 2 g of a mixture of 48 parts of polyester acrylate, 32 parts of butanediol diacrylate and 20 parts of dicyclopentadienyl hydroxyethyl acrylate, 0.1 of ($\rho^6$-2-propylbenzene)-($\rho$-$^5$-cyclopentadienyl)iron(II) hexafluorophosphate and 0.5 mmol of tertiary butyl hydroperoxide is applied to a sheet of glass by means of a 50 $\mu$doctor blade. A tack-free film is obtained after irradiation (30 seconds, distance approx. 50 cm) using a 1000-watt halogen lamp.

What is claimed is:

1. A curable composition containing a) a material which is polymerizable by free radicals or cations, a mixture of said materials or a metal which is polymerizable by free radicals and cations, b) at least one iron compound of the formula I

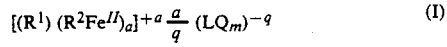
$$[(R^1)(R^2Fe^{II})_a]^{+a}\frac{a}{q}(LQ_m)^{-q} \qquad (I)$$

in which a is 1 or 2 and q is 1, 2 or 3, L is a divalent to heptavalent metal or non-metal, Q is a halogen atom, m is an integer corresponding to the sum of the valencies of L and q, $R^1$ is a $\pi$-arene and $R^2$ is the anion of a $\pi$-arene, and c) at least one electron acceptor as an oxidising agent.

2. A composition according to claim 1, wherein $R^1$ is an aromatic group having 6 to 24 carbon atoms or a heteroaromatic group having 3 to 20 carbon atoms, these groups being unsubstituted or monosubstituted or polysubstituted by identical or different halogen atoms or $C_{1-8}$-alkyl, $C_2$-$C_8$-alkenyl, $C_2$-$C_8$-alkynyl, $C_{1-8}$-alkoxy, cyano, $C_{1-8}$-alkylthio $C_{2-6}$-monocarboxylic acid ester, phenyl, $C_{2-5}$-alkanoyl or benzoyl groups.

3. A composition according to claim 1, wherein $R^2$ is the anion of an aromatic $\pi$-arene having 6 to 24 carbon atoms or of a hetero-aromatic $\pi$-arene having 3 to 20 carbon atoms, each of these being unsubstituted or monosubstituted or polysubstituted by identical or different $C_{1-8}$-alkyl, $C_2$-$C_8$-alkenyl, $C_2$-$C_8$-alkynyl, $C_{2-6}$-monocarboxylic acid ester, cyano, $C_{2-5}$-alkanoyl or benzoyl groups.

4. A composition according to claim 1, wherein a is 1 and $R^1$ is benzene, toluene, xylene, methoxybenzene, chlorobenzene, p-chlorotoluene, cumene, naphthalene, methylnaphthalene, chloronaphthalene, methoxynaphthalene, biphenyl, indene, pyrene,- perylene or diphenylene sulfide and $R^2$ is the anion of cyclopentadiene, acetylcyclopentadiene, methylcyclopentadiene, phenylcyclopentadiene or indene.

5. A composition according to claim 1, wherein a is 1, $R^1$ is $\eta^6$-pyrene or $\eta^6$-naphthalene and $R^2$ is the anion of $\eta^5$-cyclopentadiene.

6. A composition according to claim 1, wherein $[LQ_m]^{-q}$ is $SbF_6^-$, $BF_4^-$, $AsF_6^-$ or $PF_6^-$.

7. A composition according to claim 1, wherein the oxidising agent is an organic hydroperoxide, an organic per-acid or a quinone.

8. A composition according to claim 7, wherein the oxidising agent is tertiary butyl hydroperoxide, cumene hydroperoxide, triphenylmethyl hydroperoxide, tetralin hydroperoxide, $\alpha$-methyltetralin hydroperoxide, decalin hydroperoxide, perbenzoic acid, m-chloroperbenzoic acid or benzoquinone.

9. A composition according to claim 1, wherein the organic material which is polymerizable cations is an epoxide resin.

10. A composition according to claim 1, wherein the material which is polymerizable by free radicals is a monoethylenically or polyethylenically unsaturated compound.

11. A composition according to claim 1, wherein the material which is polymerizable by cations and free radicals is a mixture of an epoxide resin and a monoethylenically or polyethylenically unsaturated compound or a partial ester of an epoxide resin and acrylic acid, methacrylic acid or a mixture of these acids.

12. A composition according to claim 1, which contains the iron compound b) and the oxidising agent c) in an amount of 0.1 to 15% by weight, relative to the polymerisable organic material.

13. A composition according to claim 12, wherein the ratio by weight of the iron compound b) to the oxidising agent c) is between 1:10 and 5:1.

14. A coated material wherein a layer of the composition according to claim 1 has been applied to a substrate.

15. A process for the production of photographic relief images, which comprises irradiating a material according to claim 14 through a photomask, if appropriate while heating, and then removing the unexposed portions with a developer.

16. A process for the polymerisation of a material which is polymerizable by free radicals or cations a mixture of said materials or a material which is polymerizable by free radicals and cations, by the action of radiation in the presence of a photoinitiator and, if appropriate, by heating, wherein the photoinitiator is a mixture of a) at least one iron compound of the formula I

$$[(R^1)(R^2Fe^{II})_a]^{+a}\frac{a}{q}(LQ_m)^{-q} \qquad (I)$$

in which a is 1 or 2 and q is 1, 2 or 3, L is a divalent to heptavalent metal or non-metal, Q is a halogen atom, m is an integer corresponding to the sum of the valencies of L and q, $R^1$ is a $\pi$-arene and $R^2$ is the anion of a $\pi$-arene, and b) at least one electron acceptor as the oxidising agent and, if desired, polymerisation is completed subsequently by the application of heat.

* * * * *